United States Patent
Granger-Jones et al.

(10) Patent No.: US 10,812,025 B1
(45) Date of Patent: Oct. 20, 2020

(54) RADIO FREQUENCY AMPLIFIER CIRCUITRY WITH IMPROVED LINEARITY

(71) Applicant: Qorvo US, Inc., Greensboro, NC (US)

(72) Inventors: Marcus Granger-Jones, Scotts Valley, CA (US); George Maxim, Saratoga, CA (US); Jinsung Choi, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 28 days.

(21) Appl. No.: 16/363,087

(22) Filed: Mar. 25, 2019

(51) Int. Cl.
*H03F 1/22* (2006.01)
*H03F 1/32* (2006.01)
*H03F 3/193* (2006.01)
*H03F 1/02* (2006.01)

(52) U.S. Cl.
CPC .............. *H03F 1/32* (2013.01); *H03F 1/0233* (2013.01); *H03F 3/193* (2013.01); *H03F 2200/372* (2013.01); *H03F 2200/387* (2013.01); *H03F 2200/451* (2013.01)

(58) Field of Classification Search
CPC ......................................................... H03F 1/22
USPC .................................. 330/311, 302, 296, 285
See application file for complete search history.

(56) References Cited

U.S. PATENT DOCUMENTS

| | | | | |
|---|---|---|---|---|
| 6,803,824 B2 * | 10/2004 | Rategh | ..................... | H03F 1/223 330/302 |
| 7,714,662 B2 * | 5/2010 | Jeong | ...................... | H03F 1/223 330/126 |
| 8,233,250 B2 * | 7/2012 | Burns | ................. | H02M 3/1584 361/18 |

OTHER PUBLICATIONS

Niknejad, Ali, "EECS 242: MOS High Frequency Distortion," University of California, Berkely, Accessed Jun. 6, 2017, 70 pages.
Sanchez-Sinencio, Edgar, "Linearization Techniques for CMOS LNAs; A Tutorial," Texas A&M University, Accessed Jun. 6, 2017, 76 pages.

* cited by examiner

*Primary Examiner* — Henry Choe
(74) *Attorney, Agent, or Firm* — Withrow & Terranova, P.L.L.C.

(57) ABSTRACT

Radio frequency (RF) amplifier circuitry includes an input node, an output node, an amplifier, and bootstrap circuitry. The amplifier includes a control node coupled to the input node, a first amplifier node coupled to the output node, and a second amplifier node coupled to a fixed potential. The amplifier is configured to receive an input signal having a first frequency at the control node and change an impedance between the first amplifier node and the second amplifier node based on the input signal. The bootstrap circuitry is coupled between the control node and the second amplifier node. The bootstrap circuitry is configured to provide a low impedance path between the control node and the second amplifier node for signals having a second frequency that is equal to about twice the first frequency and provide a high impedance path for signals having a frequency outside the second frequency.

20 Claims, 9 Drawing Sheets

RADIO FREQUENCY AMPLIFIER CIRCUITRY WITH IMPROVED LINEARITY

FIELD OF THE DISCLOSURE

The present disclosure is related to radio frequency (RF) amplifier circuitry, and specifically to RF amplifier circuitry with improved linearity.

BACKGROUND

As wireless communications technologies continue to evolve, wireless communications systems implementing these technologies must become increasingly sophisticated. New wireless communications standards typically require performance above and beyond those that came before them. For example, the requirements for intermodulation distortion for radio frequency (RF) amplifier circuitry used in wireless communications systems continues to trend downwards. Intermodulation distortion results from the modulation of signals having two or more different frequencies, and is typically caused by non-linearities in RF amplifier circuitry. To meet the increasingly stringent requirements for intermodulation distortion dictated by evolving wireless communications standards, the linearity of RF amplifier circuitry must be constantly improved. In addition, it is desirable to minimize the size, cost, and power consumption of RF amplifier circuitry. Oftentimes, improving the linearity of RF amplifier circuitry comes at the cost of size, cost, and/or power consumption. In light of the above, there is a need for RF amplifier circuitry with improved linearity without a significant increase in size, cost, and/or power consumption.

SUMMARY

In one embodiment, radio frequency (RF) amplifier circuitry includes an input node, an output node, an amplifier, and bootstrap circuitry. The amplifier includes a control node coupled to the input node, a first amplifier node coupled to the output node, and a second amplifier node coupled to a fixed potential. The amplifier is configured to receive an input signal having a first frequency at the control node and change an impedance between the first amplifier node and the second amplifier node based on the input signal. The bootstrap circuitry is coupled between the control node and the second amplifier node. The bootstrap circuitry is configured to provide a low impedance path between the control node and the second amplifier node for signals having a second frequency that is equal to about twice the first frequency and provide a high impedance path between the control node and the second amplifier node for signals having a frequency outside the second frequency. By providing the bootstrap circuitry, a third order intercept point (IIP3) of the RF amplifier circuitry can be significantly improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
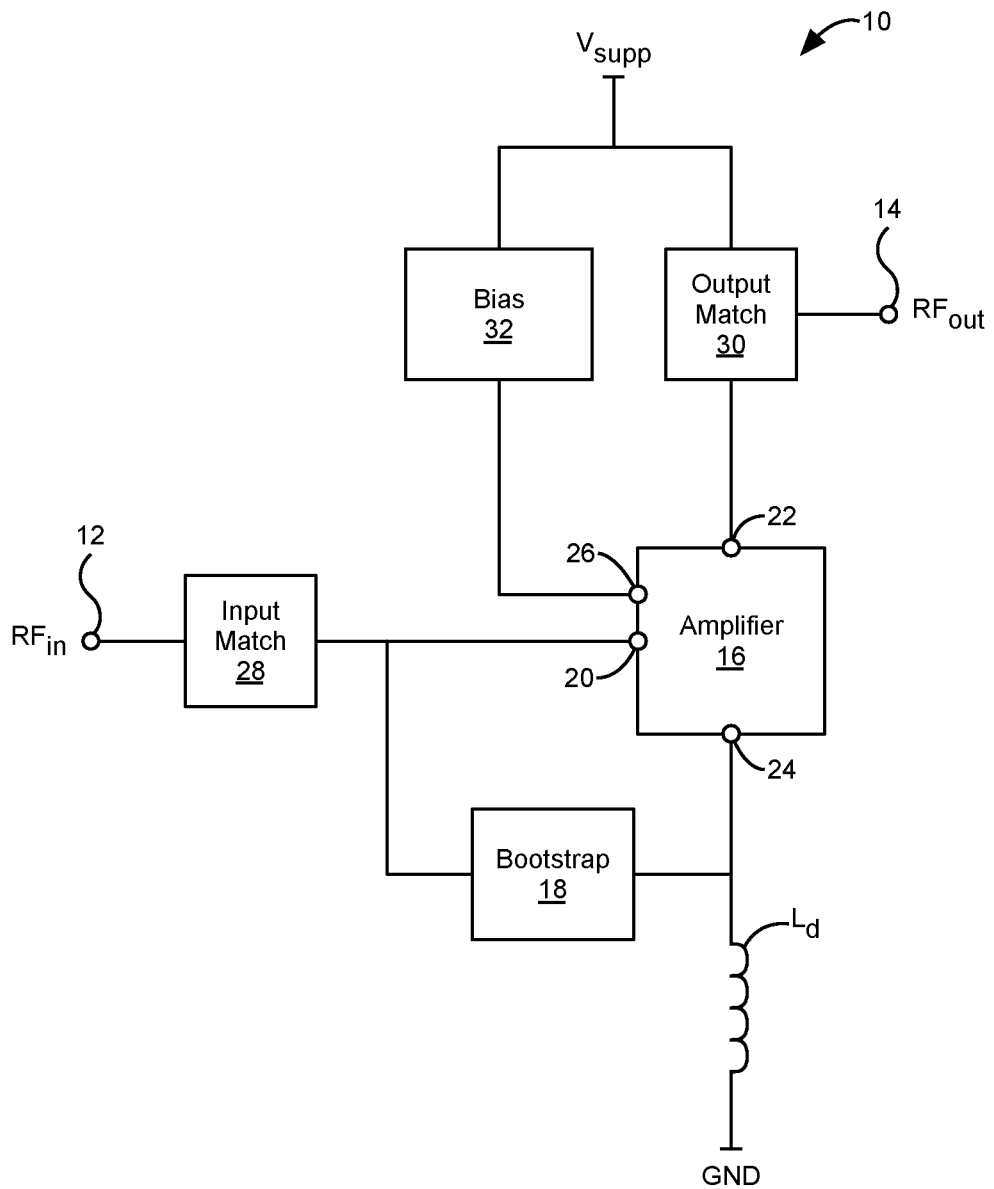
FIG. 1 illustrates radio frequency (RF) amplifier circuitry according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows radio frequency (RF) amplifier circuitry 10 according to on embodiment of the present disclosure. The RF amplifier circuitry 10 includes an input node 12, an output node 14, an amplifier 16, and bootstrap circuitry 18. The amplifier 16 includes a control node 20, a first amplifier node 22, a second amplifier node 24, and a bias node 26. The control node 20 is coupled to the input node 12 via input impedance matching circuitry 28. The first amplifier node 22 is coupled to the output node 14 via output impedance matching circuitry 30, which is in turn coupled to a supply voltage $V_{supp}$. The second amplifier node 24 is coupled to a fixed potential (i.e., ground—shown as GND) via a degeneration inductor $L_d$. The bias node 26 is coupled to bias circuitry 32, which is in turn coupled to the supply voltage $V_{supp}$. The bootstrap circuitry 18 is coupled between the control node 20 and the second amplifier node 24 of the amplifier 16.

The amplifier 16 is configured to change (i.e., modulate) an impedance between the first amplifier node 22 and the second amplifier node 24 based on an RF input signal $RF_{in}$ provided at the control node 20 via the input node 12 and the input impedance matching circuitry 28, thereby changing a voltage drop of the supply voltage $V_{supp}$ between the first amplifier node 22 and the second amplifier node 24 and thus providing an amplified version of the RF input signal $RF_{in}$ as an RF output signal $RF_{out}$ at the output node 14 via the output impedance matching circuitry 30. One or more bias signals provided at the bias node 26 (as well as at the first amplifier node 22, and possibly one or other nodes within the amplifier 16) set one or more operating characteristics of the amplifier 16. The amplifier 16 is configured to operate at a particular frequency, referred to herein as an operating frequency. That is, the amplifier 16 is designed or otherwise optimized to amplify signals at the operating frequency, which is the frequency of the RF input signal $RF_{in}$.

The input impedance matching circuitry 28 is configured to match an input impedance of the RF amplifier circuitry 10 with circuitry (not shown) coupled to the input node 12. The output impedance matching circuitry 30 is configured to match an output impedance of the RF amplifier circuitry 10 with an RF load (not shown) coupled to the output node 14.

The bias circuitry 32 is configured to provide one or more bias signals to the amplifier 16 to set one or more operating characteristics thereof. Details of the input impedance matching circuitry 28, the output impedance matching circuitry 30, and the bias circuitry 32 will be readily appreciated by those skilled in the art and thus are not discussed herein.

The bootstrap circuitry 18 is configured to provide a low impedance path between the control node 20 and the second amplifier node 24 for signals having a frequency that is about twice the operating frequency of the amplifier 16, and provide a high impedance path between the control node 20 and the second amplifier node 24 for signals at all other frequencies. Specifically, the bootstrap circuitry 18 is configured to provide a low impedance path between the control node 20 and the second amplifier node 24 for signals having a frequency that is ±10% of twice the operating frequency of the amplifier 16. Accordingly, the bootstrap circuitry may significantly improve a third order intercept point (IIP3) of the RF amplifier circuitry 10 as discussed below.

Those skilled in the art will appreciate that when a signal having two fundamental frequencies, $f_1$ and $f_2$, is amplified by RF amplifier 16, intermodulation distortion is produced as a result of non-linearity of the RF amplifier 16. Specifically, second-order intermodulation products, $2f_1$, $f_1+f_2$, and $2f_2$, are produced due to second-order non-linearity of the RF amplifier 16 and third-order intermodulation products, $3f_1, 2f_1+f_2, 2f_1-f_2, 2f_2+f_1, 2f_2-f_1$, and $3f_2$ are produced due to third-order non-linearity of the RF amplifier 16. The intermodulation products generated by the fundamental frequencies due to the non-linearity of the RF amplifier 16 are referred to herein as inherent intermodulation distortion. That is, second-order intermodulation products generated by the fundamental frequencies due to second-order non-linearity of the RF amplifier 16 and third-order intermodulation products generated by the fundamental frequencies due to third-order non-linearity of the RF amplifier 16 are referred to as inherent intermodulation distortion.

In addition to the inherent intermodulation distortion generated by the fundamental frequencies due to the non-linearity of the RF amplifier 16, additional intermodulation distortion may be created by remodulation of inherent intermodulation distortion with non-linearities of the RF amplifier 16. For example, inherent second-order intermodulation products may re-modulate with second order non-linearities in the RF amplifier 16 to produce additional third-order intermodulation products. The intermodulation products generated due to remodulation of inherent intermodulation distortion with non-linearity of the RF amplifier 16 is referred to herein as secondary intermodulation distortion.

It is generally understood that third-order intermodulation products are the most problematic form of intermodulation distortion due to the fact that some of these third-order intermodulation products can be very close in frequency to the fundamental frequencies and thus are difficult or impossible to filter out. As discussed above, third-order intermodulation products can be both inherent and secondary. Inherent third-order intermodulation products are caused by third-order non-linearity of the RF amplifier 16, while secondary third-order intermodulation products are caused by second-order non-linearity of the RF amplifier 16.

The bias signals provided to the RF amplifier 16 affect the amount of second-order non-linearity and third-order non-linearity thereof. Generally, biasing the RF amplifier 16 to reduce second-order non-linearity comes at the cost of an increase in third-order non-linearity and vice-versa. In other words, there is generally a tradeoff between biasing the RF amplifier 16 to reduce second-order non-linearity and third-order non-linearity. By extension, there is generally a tradeoff between biasing the RF amplifier 16 to reduce inherent third-order intermodulation distortion and secondary third-order intermodulation distortion. Accordingly, conventional approaches have focused on finding a bias point that balances a reduction in second-order non-linearity with third-order non-linearity, and have thus been limited in the amount of linearity achievable.

Including the bootstrap circuitry 18 significantly reduces secondary third-order intermodulation products, which, as discussed above are caused by second-order intermodulation products re-modulating with second-order non-linearity of the RF amplifier 16. This allows the RF amplifier 16 to be biased to minimize inherent third-order intermodulation products without regard for balancing the impact of said biasing on second-order intermodulation products as discussed in detail below. As a result, the IIP3 of the RF amplifier circuitry 10 can be significantly improved.

Figure 2:
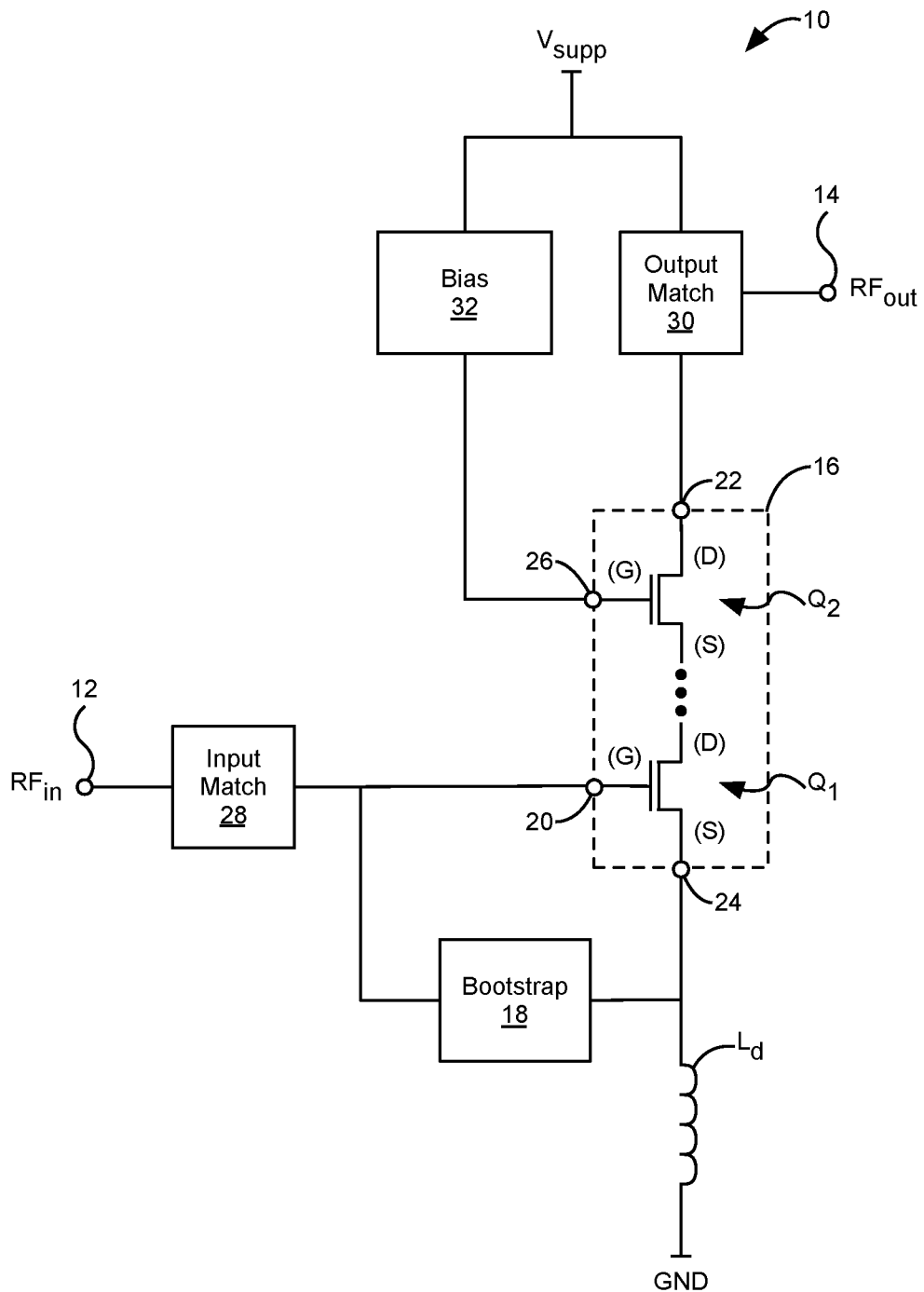
FIG. 2 illustrates RF amplifier circuitry according to one embodiment of the present disclosure.

FIG. 2 illustrates details of the RF amplifier 16 according to one embodiment of the present disclosure. The RF amplifier 16 includes a first cascode field effect transistor (FET) device $Q_1$ including a gate (G) coupled to the control node 20, a drain (D), and a source (S) coupled to the second amplifier node 24 and a second cascode FET device $Q_2$ including a gate (G) coupled to the bias node 26, a drain (D) coupled to the first amplifier node 22, and a source (S) coupled to the drain (D) of the first cascode FET device $Q_1$. While two cascode FET devices are shown, any number of cascode FET devices may be used without departing from the principles of the present disclosure. As shown, a biasing signal from the bias circuitry 32 is provided to the gate (G) of the second cascode FET device $Q_2$. The biasing signal causes a particular gate-to-source voltage $V_{gs}$ to appear across the second cascode FET device $Q_2$. If additional cascode FET devices are added, additional bias signals may be generated by the bias circuitry 32 and provided to the gate thereof. The bias circuitry 32 may also provide additional bias signals to the first cascode FET device $Q_1$ and the second cascode FET device $Q_2$ to set a desired drain-to-source voltage $V_{ds}$ thereof. The gate-to-source voltage $V_{gs}$ and the drain-to-source voltage $V_{ds}$ of the first cascode FET device $Q_1$ and the second cascode FET device $Q_2$ may affect the second-order non-linearity and third-order non-linearity of the RF amplifier 16 as discussed below.

Figure 3A:
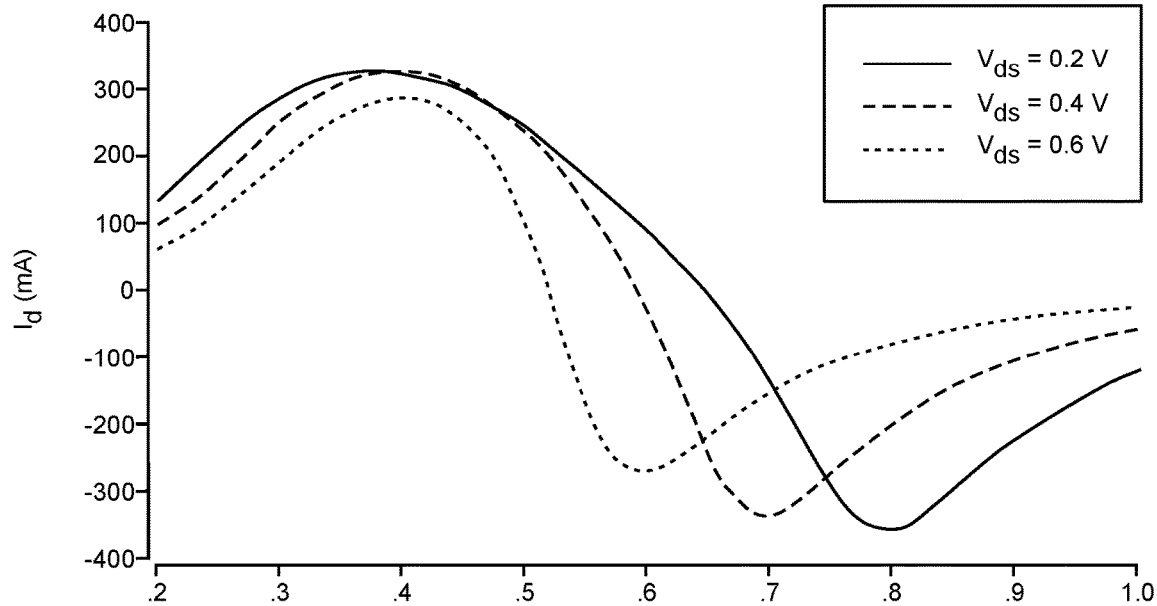
FIGS. 3A and 3B are graphs illustrating operating characteristics of RF amplifier circuitry according to one embodiment of the present disclosure.

FIG. 3A is a graph illustrating a second derivative of a relationship between drain current $I_d$ and gate-to-source voltage $V_{gs}$ for a variety of drain-to-source voltages $V_{ds}$ of the RF amplifier 16. In particular, a second derivative of $I_d$ versus $V_{gs}$ is illustrated for $V_{ds}$=0.2 V, $V_{ds}$=0.4 V, and $V_{ds}$=0.6 V. Those skilled in the art will appreciate that the second derivative of $I_d$ versus $V_{gs}$ is indicative of the level of second-order non-linearity in the RF amplifier 16.

Figure 3B:
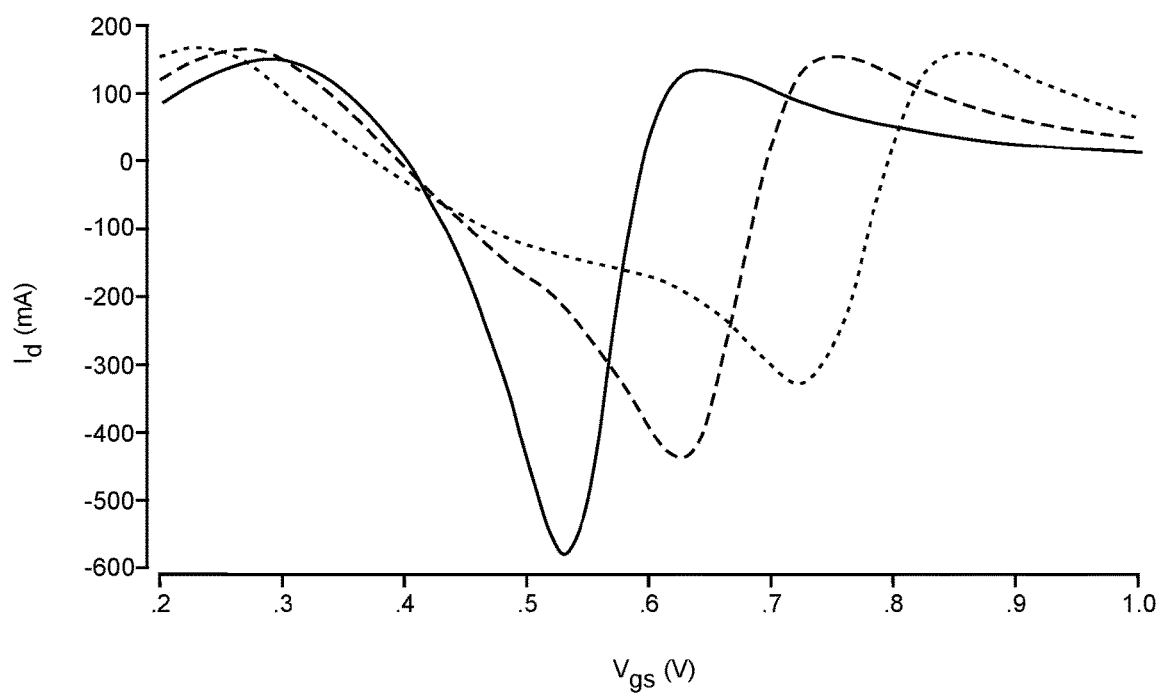

FIG. 3B is a graph illustrating a third derivative of $I_d$ versus $V_{gs}$ for $V_{ds}$ 0.2 V, $V_{ds}$=0.4 V, and $V_{ds}$=0.6 V. Those skilled in the art will appreciate that the third derivative of $I_d$ versus $V_{gs}$ is indicative of the level of third-order non-linearity in the RF amplifier 16. As can be seen with reference to both FIGS. 3A and 3B, at a gate-to-source voltage $V_{gs}$ between 0.375 V and 0.400 V, third-order non-linearity is at a minimum, but second-order non-linearity is quite high. Similarly, at a gate-to-source voltage $V_{gs}$ around 0.500 V, second-order non-linearity is at a minimum, but third-order non-linearity is quite high. As discussed above, conventional biasing schemes seek to strike a balance between the reduction of second-order non-linearity and third-order non-linearity, as optimizing for one means negatively affecting the other.

As discussed above, the bootstrap circuitry 18 significantly reduces secondary third-order intermodulation products, which, as discussed above are caused by second-order intermodulation products re-modulating with second-order non-linearity of the RF amplifier 16. This is due to a reduction of inherent second-order intermodulation products due to the low impedance path provided by the bootstrap circuitry 18 for signals around twice the operating frequency of the RF amplifier 16. This allows the RF amplifier 16 to be biased to minimize inherent third-order intermodulation products without regard for balancing the impact of said biasing on second-order intermodulation products as discussed in detail below. With reference to FIGS. 3A and 3B above, this means choosing a bias point for the gate-to-source voltage $V_{gs}$ at a minimum in the third-order non-linearity (i.e., 0.375 V to 0.400 V). The drain-to-source voltage $V_{ds}$ may also be chosen to minimize third-order non-linearity. Biasing the RF amplifier 16 to minimize third-order non-linearity may cause second-order non-linearity to be quite high, however, this is not of concern since the bootstrap circuitry 18 significantly reduces second-order intermodulation products caused by said second-order non-linearity. Accordingly, the IIP3 of the RF amplifier circuitry 10 may be significantly improved.

In additional embodiments, the bootstrap circuitry 18 is configured to provide a low impedance path between the control node 20 and the second amplifier node 24 at about 10% less than twice the operating frequency of the RF amplifier 16. In such an embodiment, the RF amplifier 16 may be biased to somewhat balance a reduction in the second-order non-linearity and the third-order non-linearity thereof. That is, a bias point may be chosen ($V_{gs}$ and $V_{ds}$) such that both second-order and third-order non-linearity are still present in the RF amplifier 16. However, the IIP3 of the RF amplifier circuitry 10 may still be significantly improved.

Figure 4:
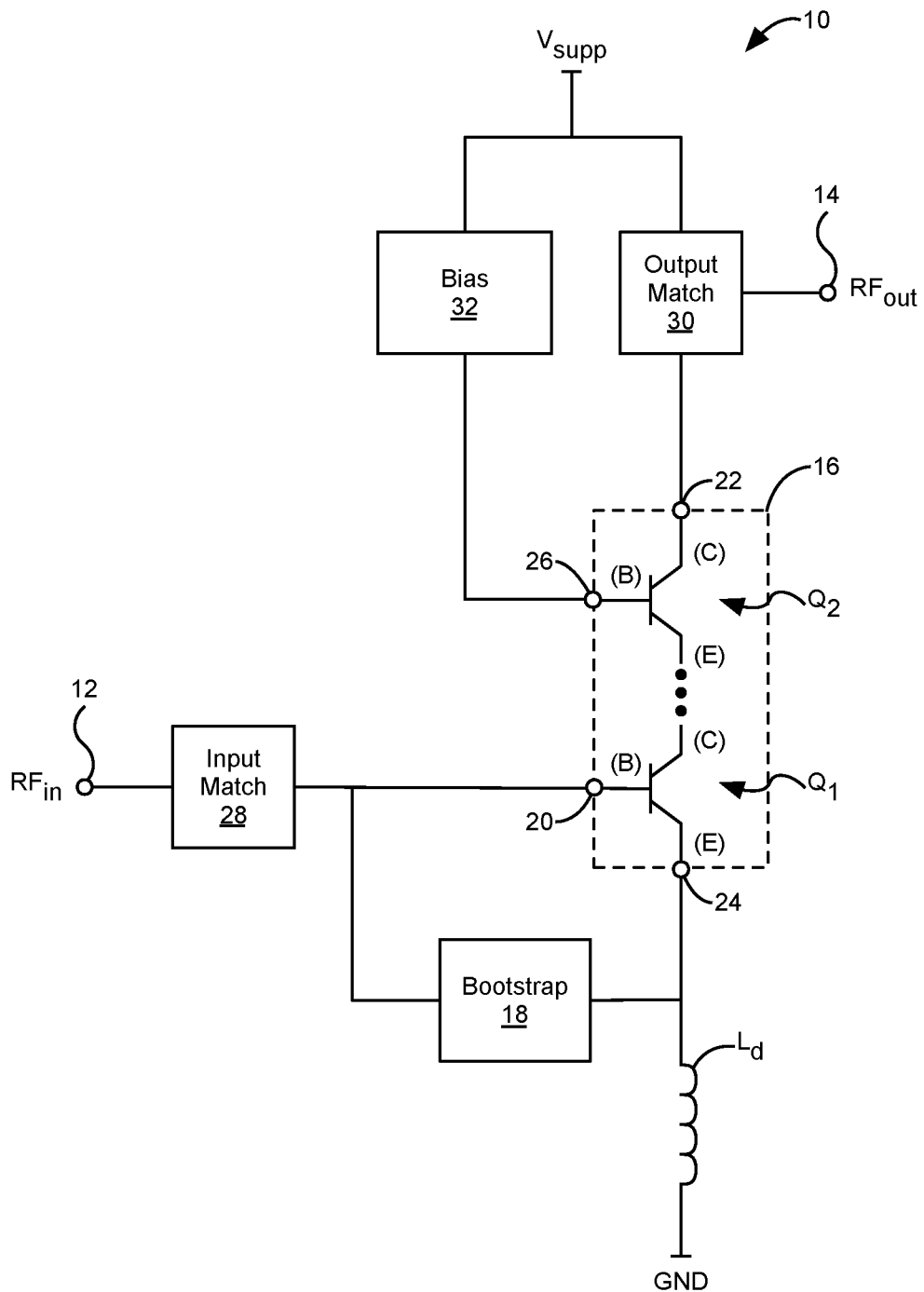
FIG. 4 illustrates RF amplifier circuitry according to one embodiment of the present disclosure.

FIG. 4 shows the RF amplifier circuitry 10 according to an additional embodiment in which the RF amplifier 16 includes a first cascode bipolar junction transistor (BJT) device $Q_1$ and a second cascode BJT device $Q_2$. The first cascode BJT device $Q_1$ includes a base (B) coupled to the control node 20, a collector (C), and an emitter (E) coupled to the second amplifier node 24. The second cascode BJT device $Q_2$ includes a base (B) coupled to the bias node 26, a collector (C) coupled to the first amplifier node 22, and an emitter (E) coupled to the collector (C) of the first cascode BJT device $Q_2$. The RF amplifier 16 may operate in substantially the same way as discussed above. While only two BJTs are shown in the RF amplifier 16, any number of BJT devices may be included in the RF amplifier 16 without departing from the principles described herein. While not shown, the RF amplifier 16 may similarly comprise any type of transistor devices such as metal-oxide-semiconductor field-effect transistors (MOSFETs), junction field-effect transistors (JFETs), high electron mobility transistors (HEMTs), and the like.

Figure 5:
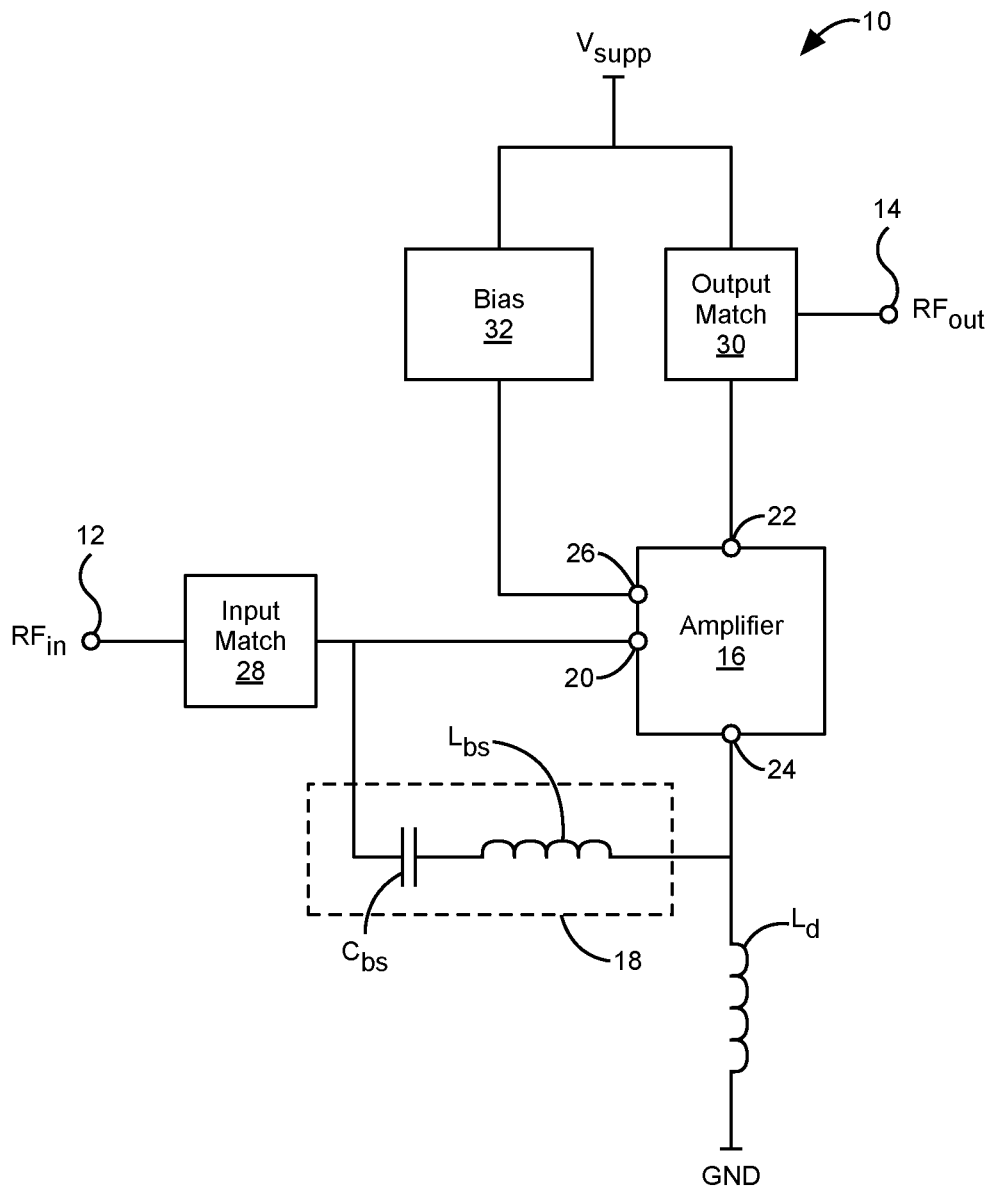
FIG. 5 illustrates RF amplifier circuitry according to one embodiment of the present disclosure.

FIG. 5 shows the RF amplifier circuitry 10 including details of the bootstrap circuitry 18 according to one embodiment of the present disclosure. As shown, the bootstrap circuitry 18 includes a bootstrap capacitor $C_{bs}$ coupled in series with a bootstrap inductor $L_{bs}$ between the control node 20 and the second amplifier node 24. The capacitance of the bootstrap capacitor $C_{bs}$ and the inductance of the bootstrap inductor $L_{bs}$ may be chosen to have a series resonant frequency at around twice the operating frequency of the RF amplifier 16 as discussed above. Those skilled in the art will appreciate that at the series resonant frequency of an LC circuit, an impedance thereof is minimized, such that the bootstrap circuitry 18 provides a low impedance path between the control node 20 and the second amplifier node 24 at the series resonant frequency thereof. At all other frequencies, the bootstrap circuitry 18 may provide a high impedance path between the control node 20 and the second amplifier node 24. As defined herein, a low impedance path has an impedance less than 500 and a high impedance path has an impedance greater than 500.

Figure 6:
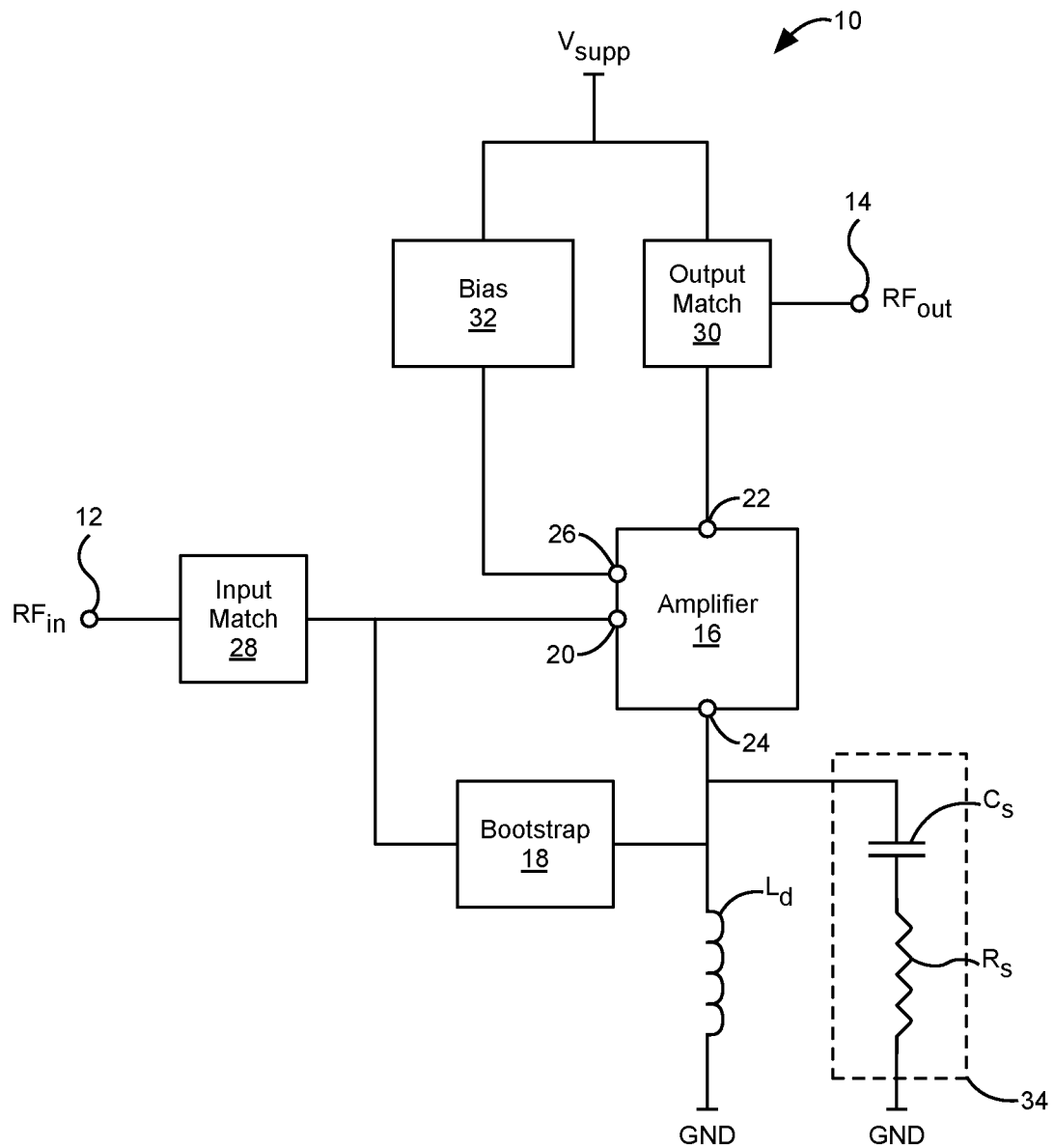
FIG. 6 illustrates RF amplifier circuitry according to one embodiment of the present disclosure.

FIG. 6 shows the RF amplifier circuitry 10 including stabilizing circuitry 34 for the bootstrap circuitry 18 according to one embodiment of the present disclosure. The stabilizing circuitry 34 is coupled between the second amplifier node 24 and ground, and is configured to selectively introduce loss in order to prevent instability in the RF amplifier circuitry 10 due to the bootstrap circuitry 18. Those skilled in the art will appreciate that providing a resonant circuit across the control node 20 and the second amplifier node 24 may provide only conditional stability. By introducing loss into the RF amplifier circuitry 10, the possibility of instability may be significantly reduced. The stabilizing circuitry is shown including a stabilizing capacitive element $C_s$ in series with a stabilizing resistive element $R_s$ between the second amplifier node 24 and ground. The stabilizing capacitive element $C_s$ may provide AC coupling to the stabilizing resistive element $R_s$ and therefore reduce an impact of the stabilizing circuitry 34 at the operating frequency of the RF amplifier 16. While the stabilizing circuitry 34 is shown including the stabilizing capacitive element $C_s$ and the stabilizing resistive element $R_s$, those skilled in the art will readily appreciate that the objective of the stabilizing circuitry 34 may be accomplished with the use of any number of components arranged in myriad ways, all of which are contemplated herein.

Figure 7:
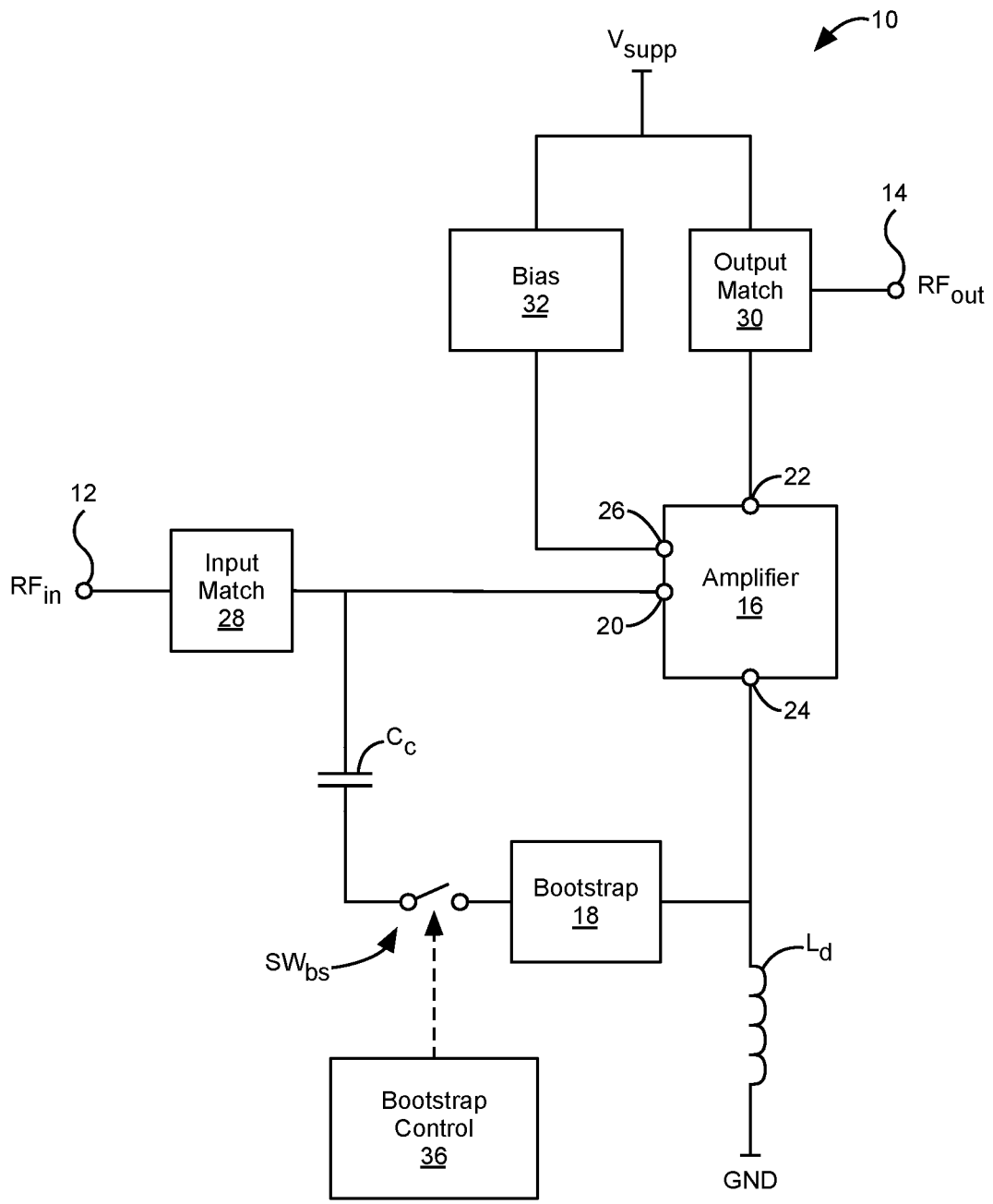
FIG. 7 illustrates RF amplifier circuitry according to one embodiment of the present disclosure.

FIG. 7 shows the RF amplifier circuitry 10 wherein the bootstrap circuitry 18 can be selectively coupled between the control node 20 and the second amplifier node 24 according to one embodiment of the present disclosure. To accomplish this, the RF amplifier circuitry 10 includes a bootstrap switching element $SW_{bs}$ coupled in parallel with the bootstrap circuitry 18. Further, a compensation capacitor $C_c$ is coupled between the control node 20 and the bootstrap circuitry 18. Bootstrap switching control circuitry 36 is coupled to the bootstrap switching element $SW_{bs}$ and configured to control the bootstrap switching element $SW_{bs}$ such that the bootstrap circuitry 18 can be selectively coupled and decoupled from the control node 20. Specifically, in a high linearity mode of operation the bootstrap switching control circuitry 36 may cause the bootstrap switching element $SW_{bs}$ to remain open such that the bootstrap circuitry 18 operates as described above to improve the IIP3 of the RF amplifier circuitry 10. In a low noise figure mode of operation, the bootstrap switching control circuitry 36 may cause the bootstrap switching element $SW_{bs}$ to close and thus short circuitry the bootstrap circuitry 18. Accordingly, signals from the control node 20 may bypass the bootstrap circuitry 18, which may improve the noise figure mode of operation of the RF amplifier circuitry 10.

Figure 8:
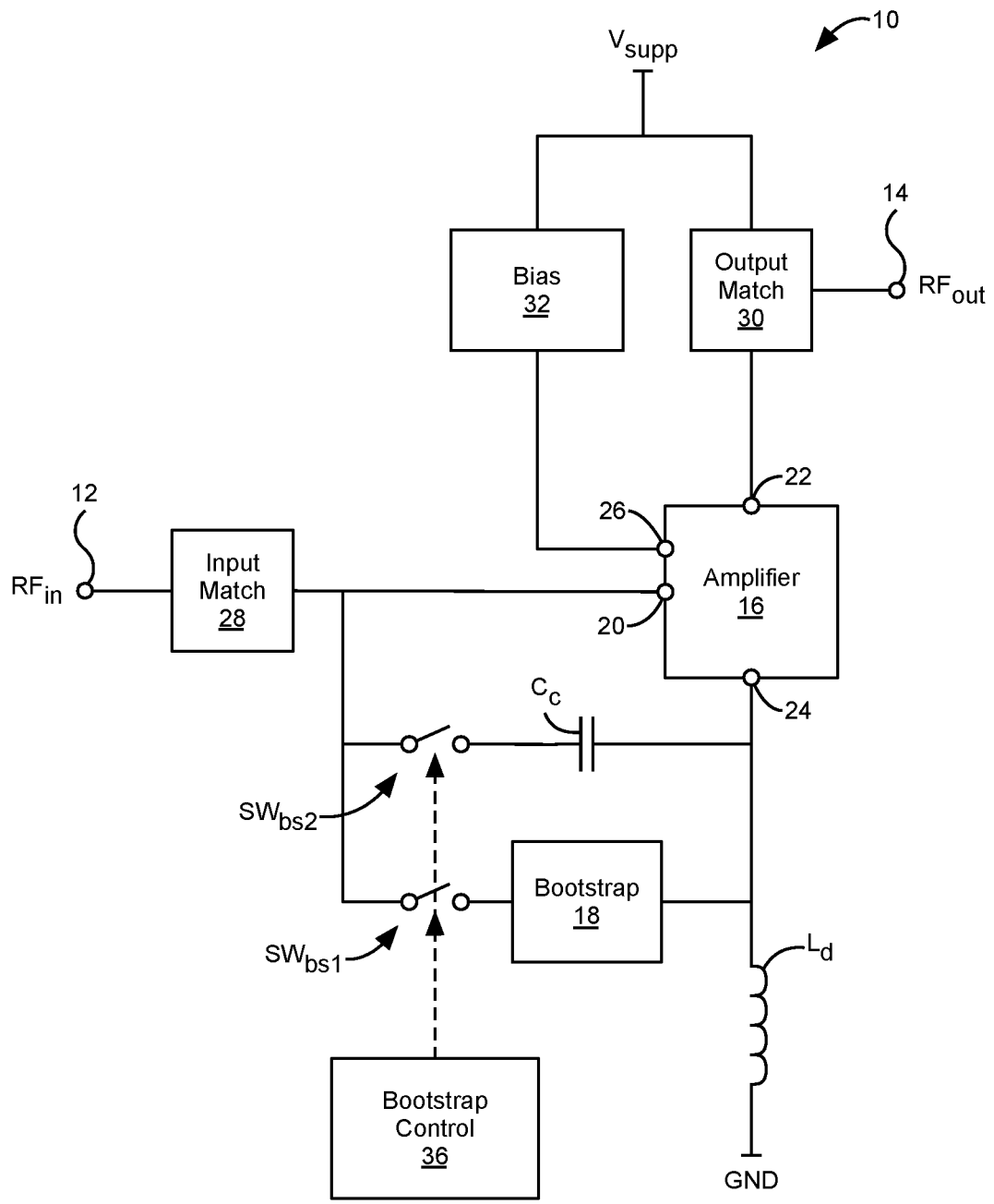
FIG. 8 illustrates RF amplifier circuitry according to one embodiment of the present disclosure.

FIG. 8 shows the RF amplifier circuitry 10 wherein the bootstrap circuitry 18 can be selectively coupled between the control node 20 and the second amplifier node 24 according to one embodiment of the present disclosure. To accomplish this, the RF amplifier circuitry 10 includes a first bootstrap switching element $SW_{bs1}$ coupled between the control node 20 and the bootstrap circuitry 18. The bootstrap switching control circuitry 36 is coupled to the first bootstrap switching element $SW_{bs1}$ and configured to control the first bootstrap switching element $SW_{bs1}$ such that the bootstrap circuitry 18 can be selectively coupled and decoupled from the control node 20.

The bootstrap switching control circuitry 36 may cause the first bootstrap switching element $SW_{bs1}$ to couple the bootstrap circuitry 18 to the control node 20 in a high linearity mode of operation such that the bootstrap circuitry 18 operates as described above to improve the IIP3 of the RF amplifier circuitry 10. In a low noise figure mode of operation, the bootstrap switching control circuitry 36 may cause the first bootstrap switching element $SW_{bs1}$ to decouple the bootstrap circuitry 18 from the control node 20 such that signals from the control node 20 are not provided to the bootstrap circuitry 18. This may improve a noise figure of the RF amplifier circuitry 10. However, decoupling the bootstrap circuitry 18 from the control node 20 may change an input impedance of the RF amplifier circuitry 10. Accordingly, a second bootstrap switching element $SW_{bs2}$ may be provided in series with a compensation capacitor $C_c$ between the control node 20 and the second amplifier node 24. The bootstrap switching control circuitry 36 may operate the first bootstrap switching element $SW_{bs1}$ and the second bootstrap switching element $SW_{bs2}$ in a complementary fashion such that when the first bootstrap switching element $SW_{bs1}$ is open, the second bootstrap switching element $SW_{bs2}$ is closed, and vice versa. The compensation capacitor $C_c$ may thus be provided between the control node 20 and the second amplifier node 24 when the bootstrap circuitry 18 is decoupled from the control node 20. The compensation capacitor $C_c$ may at least partially compensate for the change in input impedance of the RF amplifier circuitry 10 caused by decoupling the bootstrap circuitry 18 from the control node 20 such that the input impedance of the RF amplifier circuitry 10 remains substantially constant regardless of whether or not the bootstrap circuitry 18 is in use.

Figure 9:
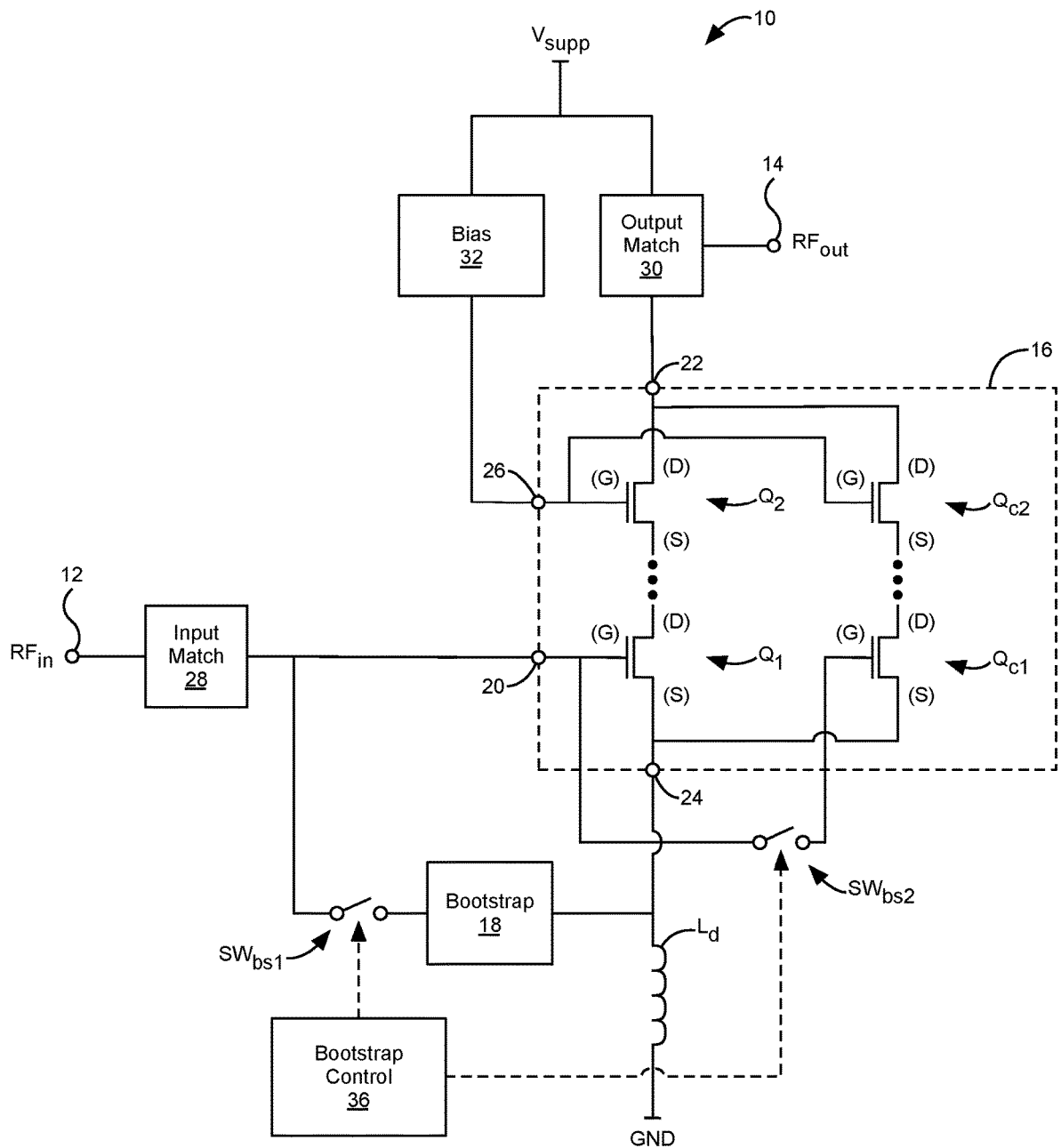
FIG. 9 illustrates RF amplifier circuitry according to one embodiment of the present disclosure.

FIG. 9 shows the RF amplifier circuitry 10 wherein the bootstrap circuitry 18 can be selectively coupled between the control node 20 and the second amplifier node 24 according to yet another embodiment of the present disclosure. To accomplish this, the RF amplifier circuitry 10 includes a first bootstrap switching element $SW_{bs1}$ coupled between the control node 20 and the bootstrap circuitry 18. Bootstrap switching control circuitry 36 is coupled to the first bootstrap switching element $SW_{bs1}$ and configured to control the first bootstrap switching element $SW_{bs1}$ such that the bootstrap circuitry 18 can be selectively coupled and decoupled from the control node 20.

As discussed above, the bootstrap switching control circuitry 36 may cause the first bootstrap switching element $SW_{bs1}$ to couple the bootstrap circuitry 18 to the control node 20 in a high linearity mode of operation such that the bootstrap circuitry 18 operates as discussed above to improve the IIP3 of the RF amplifier circuitry 10. In a low noise figure mode of operation, the bootstrap switching control circuitry 36 may cause the first bootstrap switching element $SW_{bs1}$ to decouple the bootstrap circuitry 18 from the control node 20 such that signals from the control node 20 are not provided to the bootstrap circuitry 18. This may improve a noise figure of the RF amplifier circuitry 10. However, decoupling the bootstrap circuitry 18 from the control node 20 may change an input impedance of the RF amplifier circuitry 10. In an embodiment in which the RF amplifier 16 includes a first cascode FET device Q1 and a second cascode FET device Q2 as discussed above with respect to FIG. 2 and shown in FIG. 9, a first compensation cascode FET device $Q_{c1}$ and a second compensation cascode FET device $Q_{c2}$ may be provided in parallel with the first cascode FET device Q1 and the second cascode FET device Q2. The first compensation cascode FET device $Q_{c2}$ includes a gate (G) coupled to a gate of the first cascode FET device Q1 via a second bootstrap switching element $SW_{bs2}$, a drain (D), and a source (S) coupled to ground via the degeneration inductor $L_d$. The second compensation cascode FET device $Q_{c2}$ includes a gate (G) coupled to the bias node 26, a drain (D) coupled to the first amplifier node 22, and a source (S) coupled to the drain (D) of the first compensation cascode FET device $Q_{c2}$.

The bootstrap switching control circuitry 36 may operate the first bootstrap switching element $SW_{bs1}$ and the second bootstrap switching element $SW_{bs2}$ in a complementary fashion such that when the first bootstrap switching element $SW_{bs1}$ is open, the second bootstrap switching element $SW_{bs2}$ is closed, and vice versa. The first compensation cascode FET device $Q_{c2}$ and the second compensation cascode FET device $Q_{c2}$ may thus be coupled to the control node 20 and thus activate when the bootstrap circuitry 18 is decoupled from the control node 20. The first compensation cascode FET device $Q_{c2}$ and the second compensation cascode FET device $Q_{c2}$ act as a parallel amplification stage when coupled to the control node 20. This may not only compensate for the change in input impedance due to decoupling of the bootstrap circuitry 18 from the control node 20, but also may improve the noise figure and gain of the RF amplifier circuitry 10. Notably, the principles in FIG. 9 apply equally to other types of the devices for the RF amplifier 16 such as BJTs, HEMTs, and the like.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) amplifier circuitry comprising:
   an input node and an output node;
   an amplifier comprising a control node coupled to the input node, a first amplifier node coupled to the output node, and a second amplifier node coupled to a fixed potential, the amplifier configured to receive an input signal having a first frequency at the control node and change an impedance between the first amplifier node and the second amplifier node based on the input signal; and
   bootstrap circuitry coupled between the control node and the second amplifier node and configured to:
      provide a low impedance path between the control node and the second amplifier node for signals having a second frequency that is equal to about twice the first frequency; and
      provide a high impedance path between the control node and the second amplifier node for signals having a frequency outside the second frequency.

2. The RF amplifier circuitry of claim 1 wherein the bootstrap circuitry comprises:
   a bootstrap capacitive element; and
   a bootstrap inductive element coupled in series with the bootstrap capacitive element between the control node and the second amplifier node.

3. The RF amplifier circuitry of claim 2 wherein a capacitance of the bootstrap capacitive element and an inductance of the bootstrap inductive element are chosen such that a series resonant frequency of the bootstrap circuitry occurs at the second frequency.

4. The RF amplifier circuitry of claim 3 further comprising a degeneration inductor coupled between the second amplifier node and the fixed potential.

5. The RF amplifier circuitry of claim 3 further comprising feedback stability circuitry coupled between the second amplifier node and the fixed potential, the feedback stability circuitry configured to provide an impedance between the second amplifier node and the fixed potential at the series resonant frequency of the bootstrap circuitry.

6. The RF amplifier circuitry of claim 5 wherein the feedback stability circuitry comprises a feedback stability resistive element coupled in series with a feedback stability capacitive element between the second amplifier node and the fixed potential.

7. The RF amplifier circuitry of claim 6 further comprising a degeneration inductor coupled in parallel with the feedback stability circuitry between the second amplifier terminal and the fixed potential.

8. The RF amplifier circuitry of claim 3 further comprising:
   a bootstrap switching element coupled to the bootstrap circuitry; and
   bootstrap control circuitry coupled to the bootstrap switching element and configured to:
      in a low noise figure mode of operation of the RF amplifier circuitry, cause the bootstrap switching element to isolate signals at the control node of the amplifier from the bootstrap circuitry; and
      in a high linearity mode of operation of the RF amplifier circuitry, cause the bootstrap switching element to provide signals at the control node of the amplifier to the bootstrap circuitry.

9. The RF amplifier circuitry of claim 8 wherein the bootstrap switching element is coupled in series with the bootstrap circuitry between the control node and the bootstrap circuitry.

10. The RF amplifier circuitry of claim 8 wherein:
    the RF amplifier circuitry further comprises a compensation capacitor coupled in series between the control node and the bootstrap circuitry; and
    the bootstrap switching element is coupled in parallel with the bootstrap circuitry such that the bootstrap switching element is configured to short circuit the bootstrap circuitry in the low noise figure mode.

11. The RF amplifier circuitry of claim 8 further comprising one or more additional bootstrap switching elements, wherein the bootstrap control circuitry is configured to:
    in the low noise figure mode of operation of the RF amplifier circuitry, cause the one or more additional bootstrap switching elements to couple one or more additional components to the control node of the amplifier; and
    in the high linearity mode of operation of the RF amplifier circuitry, cause the one or more additional bootstrap switching elements to decouple the one or more additional components from the control node of the amplifier such that an input impedance at the input node remains substantially constant between the low noise figure mode of operation and the high linearity mode of operation of the RF amplifier circuitry.

12. The RF amplifier circuitry of claim 11 wherein the one or more additional components comprise a compensation capacitor coupled to the second amplifier node such that in the low noise figure mode of operation of the RF amplifier circuitry the one or more additional bootstrap switching elements couple the compensation capacitor between the control node and the second amplifier node.

13. The RF amplifier circuitry of claim 11 wherein the amplifier comprises:
- a first cascode field effect transistor (FET) device comprising a gate coupled to the control node, a drain, and a source coupled to the second amplifier node; and
- a second cascode FET device comprising a gate coupled to a biasing node, a drain coupled to the second amplifier node, and a source coupled to the drain of the first cascode FET device.

14. The RF amplifier circuitry of claim 13 wherein the one or more additional components comprise:
- a first additional cascode field effect transistor (FET) device comprising a gate coupled to the control node via the one or more additional bootstrap switching elements, a drain, and a source coupled to the second amplifier node; and
- a second additional cascode field effect transistor (FET) comprising a gate coupled to the biasing node, a drain coupled to the second amplifier node, and a source coupled to the drain of the first additional cascode FET device.

15. The RF amplifier circuitry of claim 3 further comprising bias circuitry coupled to a bias node of the amplifier and configured to provide a bias signal to the amplifier circuitry such that a magnitude of third order intermodulation distortion generated due to third order non-linearity of the amplifier is minimized.

16. The RF amplifier circuitry of claim 3 further comprising bias circuitry coupled to a bias node of the amplifier and configured to provide a bias signal to the amplifier circuitry such that third order intermodulation products generated by remodulation of second order intermodulation distortion with second order non-linearity of the amplifier at least partially cancel third order intermodulation signals generated due to third order non-linearity of the amplifier.

17. The RF amplifier circuitry of claim 3 wherein the amplifier comprises a field effect transistor (FET) device comprising a gate coupled to the control node, a drain coupled to the first amplifier node, and a source coupled to the second amplifier node.

18. The RF amplifier circuitry of claim 3 wherein the amplifier comprises:
- a first cascode field effect transistor (FET) device comprising a gate coupled to the control node, a drain, and a source coupled to the second amplifier node; and
- a second cascode FET device comprising a gate coupled to a biasing node, a drain coupled to the second amplifier node, and a source coupled to the drain of the first cascode FET device.

19. The RF amplifier circuitry of claim 3 wherein the amplifier comprises a bipolar junction transistor (BJT) device comprising a base coupled to the control node, a collector coupled to the first amplifier node, and an emitter coupled to the second amplifier node.

20. The RF amplifier circuitry of claim 3 wherein the amplifier comprises:
- a first cascode BJT device comprising a base coupled to the control node, a collector, and an emitter coupled to the second amplifier node; and
- a second cascode BJT device comprising a base coupled to a biasing node, a collector coupled to the first amplifier node, and an emitter coupled to a collector of the first cascode BJT device.

* * * * *

UNITED STATES PATENT AND TRADEMARK OFFICE
CERTIFICATE OF CORRECTION

PATENT NO. : 10,812,025 B1
APPLICATION NO. : 16/363087
DATED : October 20, 2020
INVENTOR(S) : Marcus Granger-Jones et al.

It is certified that error appears in the above-identified patent and that said Letters Patent is hereby corrected as shown below:

In the Specification

Column 7, Lines 11 and 12, replace "500" with --50Ω--.
Column 9, Lines 20 and 24, replace "$Q_{c2}$" with --$Q_{c1}$--.

Signed and Sealed this
Twenty-second Day of December, 2020

Andrei Iancu
*Director of the United States Patent and Trademark Office*